(12) United States Patent
Wu

(10) Patent No.: US 6,649,308 B1
(45) Date of Patent: *Nov. 18, 2003

(54) ULTRA-SHORT CHANNEL NMOSFETS WITH SELF-ALIGNED SILICIDE CONTACT

(75) Inventor: Shye-Lin Wu, Hsinchu (TW)

(73) Assignee: Texas Instruments-Acer Incorporated, Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/050,670

(22) Filed: Mar. 30, 1998

(51) Int. Cl.[7] .............................. G03F 9/00; G03C 5/00
(52) U.S. Cl. ........................... 430/5; 430/311; 430/330
(58) Field of Search .................. 257/344, 900, 257/413; 438/305, 303, 639, 975, 724; 430/5, 313, 314, 316, 311, 330

(56) References Cited

U.S. PATENT DOCUMENTS

| 5,504,024 A | * | 4/1996 | Hsu | 437/44 |
| 5,591,650 A | * | 1/1997 | Hsu et al. | 438/303 |
| 5,656,519 A | * | 8/1997 | Mogami | 438/303 |
| 5,753,557 A | * | 5/1998 | Tseng | 438/303 |
| 5,814,545 A | * | 9/1998 | Seddon et al. | 438/303 |
| 6,071,802 A | * | 6/2000 | Ban et al. | 438/618 |

* cited by examiner

*Primary Examiner*—Mark F. Huff
*Assistant Examiner*—Saleha R. Mohamedulla
(74) *Attorney, Agent, or Firm*—Dickinson Wright PLLC

(57) ABSTRACT

The ultra-short channel transistor in a semiconductor substrate includes a gate structure that is formed on the substrate. Side-wall spacers are formed on the side walls of the gate structure as an impurities-diffusive source. Source and drain regions are formed in the substrate. A metal silicide contact is formed on the top surface of the gate structure, and on the surface of the source and drain regions. Extended source and drain regions are formed beneath the side-wall spacers and connect next to the source and drain regions.

16 Claims, 4 Drawing Sheets

ULTRA-SHORT CHANNEL NMOSFETS WITH SELF-ALIGNED SILICIDE CONTACT

FIELD OF THE INVENTION

The present invention relates to a semiconductor device, and more specifically, to a method of fabricating a metal oxide semiconductor field effect transistor (MOSFET).

BACKGROUND OF THE INVENTION

Metal oxide semiconductor field effect transistors (MOSFETs) have been traditionally used and widely applied in the semiconductor technologies. Device dimensions are continuously scaled down to achieve high-performance CMOS ULSIs (Ultra-Large Scale Integrations). For such scaled devices, however, parasitics such as RC delay and source/drain series resistance easily degrade the circuit performance. As suggested in the reference by M. T. Takagi, et al., in IEDM Tech. Dig. p. 455, 1996, the degration factor of propagation delay on a gate electrode is a strong function of both channel width and gate electrode sheet resistance. Thus, the finite value of gate electrode sheet resistance limits the maximum channel width which can be used in ULSIs.

The Self-Aligned Ti Silicide contact source/drain and gate (Ti salicide) process is one of the candidates for low gate electrode sheet resistance and low source/drain resistance. The ultra-short channel MOSFET with self-aligned silicide contact is required for high-speed circuit. However, as mentioned in the article by M. Ono, et al., in IEDM Tech. Dig., p. 119, 1993, it is difficult to define the gate length to be below 0.1 μm due to the limitation of current optical lithography.

SUMMARY OF THE INVENTION

The ultra-short channel transistor in a semiconductor substrate includes a gate structure that is formed on the substrate. Side-wall spacers are formed on the side walls of the gate structure as an impurities-diffusive source. Source and drain regions are formed in the substrate. A metal silicide contact is formed on the top surface of the gate structure, and on the surface of the source and drain regions. Extended source and drain regions are formed beneath the side-wall spacers and are connected next to the source and drain regions.

After growing a thin gate oxide film on silicon substrate, an undoped poly-Si or amorphous Si (α-Si) film is deposited by the LPCVD system. Then, a thin nitride film and a n+ doped poly-Si film are deposited. The gate region is defined to etch back the n+ doped poly-Si film. A low temperature steam oxidation process is performed to oxidize the n+ doped poly-Si. At this step, the size of the n+ doped poly-Si film can be reduced to the range of nanometer dimensions. The thermal polyoxide film is removed by BOE or diluted HF solution and the residual doped poly-Si were used as a mask to etch cap nitride film. The residual n+ doped poly-Si and the cap nitride film are used as masks to etch undoped poly-Si to form an ultra-short channel gate. For a nMOSFET fabrication, CVD PSG film is deposited and then etched back to form PSG spacers. Similarily, for PMOSFET fabrication, a CVD BSG film is deposited and then etched back to form BSG spacers. The cap nitride film was removed and a noble metal was deposited on all areas. The source, drain, and gate are doped by a high dose arsenic or phosphorous implant through the noble (or refractory) metal. Finally, the two-step RTP annealing process is used to form self-aligned silicided (salicided) contact MOSFET.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 11:
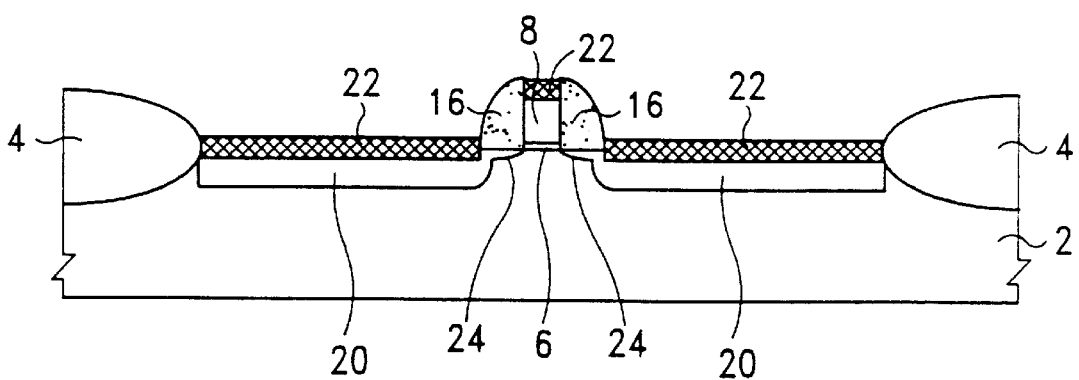
FIG. 11 is a cross-sectional view of a semiconductor substrate illustrating the step of performing a two-step RTP process to form SALICIDE and extended S/D junction according to the present invention.

A new structure of an ultra-short shallow MOSFET with self-aligned silicide contact is disclosed herein. The cross sectional view of an ultra-short shallow MOSFET with self-aligned silicide contact is shown in FIG. 11. The structure of the ultra-shallow silicide contact includes (1) a gate structure with side-wall spacers 16 formed on the substrate 2 (2) a metal silicide 22 and (3) an extended source and drain region 24 formed next to the source and drain region 20 in the substrate 2. One feature of the MOSFET is that the gate is formed to have an ultra-short channel. The other feature of the MOSFET is that the source and drain region are formed to have extended source and drain regions.

The gate structure includes a first silicon gate 8 and a gate oxide layer 6. The gate oxide layer 6 is formed over the silicon substrate 2, and the gate 8 is formed of conductive material (polysilicon) and formed on the gate oxide layer. Preferably, the first silicon gate 8 is formed of undoped polysilicon. Side-wall spacers 16 are formed on the side walls of the first silicon gate 8. Preferably, the side-wall spacers 16 are formed of phosphosilicate glass (PSG) oxide film for nMOSFET (BSG oxide film for pMOSFET) to serve as a diffusion source to form the extended source and drain junction 24 for the minimun junction depth requirement.

Source and drain regions 22 are formed in the silicon substrate 2 with a high dosage arsenic and/or phosphorus implantation by using the gate 8 and the side-wall spacers as mask.

A metal silicide 22 is formed on the top surface of the gate 8, and on the surface of the source and drain regions 22 by performing a first step rapid thermal process. Extended source and drain regions 24 are formed next to the source and drain regions 22 by performing a second step rapid thermal process to drive the impurities in PSG (or BSG) spacers into the silicon substrate 2.

The formation of the utra-shallow channel MOSFET described herein includes many process steps that are well known in the art. For example, the process of lithography and etching are well known in the art and are used extensively herein. Accordingly, there are no related discussions of these well-known technologies.

The present invention will be described in detail with reference to the drawings.

Figure 1:
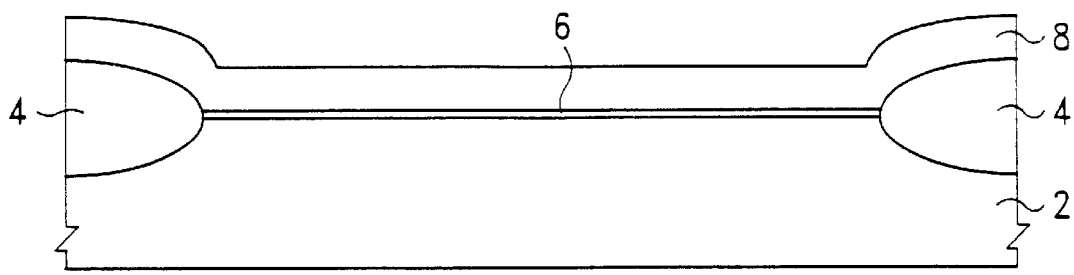
FIG. 1 is a cross-sectional view of a semiconductor substrate illustrating the step of growing a thin gate oxide layer and forming an undoped poly-Si layer on a semiconductor substrate according to the present invention.

Please refer to FIG. 1. In a preferred embodiment, a single crystal silicon substrate 2 with a <100> crystallographic orientation is provided. A plurality of thick field oxide (FOX) regions 4 are formed to provide isolation between devices on the substrate. For example, the FOX regions 4 can be formed via lithography and etching steps to etch a silicon nitride-silicon dioxide composition layer. After the photoresist is removed and wet cleaned, thermal oxidation in an oxygen-steam environment is used to grow the FOX region 4 to a thickness of about 3000–8000 angstroms. The FOX region 4 can be replaced by a plurality of shallow trench isolations, as is known in the art. Next, a silicon dioxide layer 6 is formed on the top surface of the substrate 2 to serve as a gate oxide layer. Typically, the silicon dioxide layer 6 is formed in oxygen ambient at a temperature of about 700 to 1100 centigrade degrees. In this embodiment, the thickness of the silicon dioxide layer is approximately 15 to 250 angstroms. Alternatively, the oxide layer 6 may be formed using any suitable oxide chemical compositions and procedure.

An undoped polysilicon layer 8 is then deposited on the FOX regions 4 and the silicon dioxide layer 6 using a low-pressure chemical vapor deposition process. The undoped poly-Si layer 8 can be replaced by amorphous-Si layer. In an embodiment, the thickness of the undoped polysilicon layer 8 is about 500 to 3000 angstroms. Next, standard lithography and etching steps are used to etch the silicon dioxide 4 and the polysilicon layer for forming a gate silicon structure consisting of the gate oxide 6 and the polysilicon 8.

Figure 2:
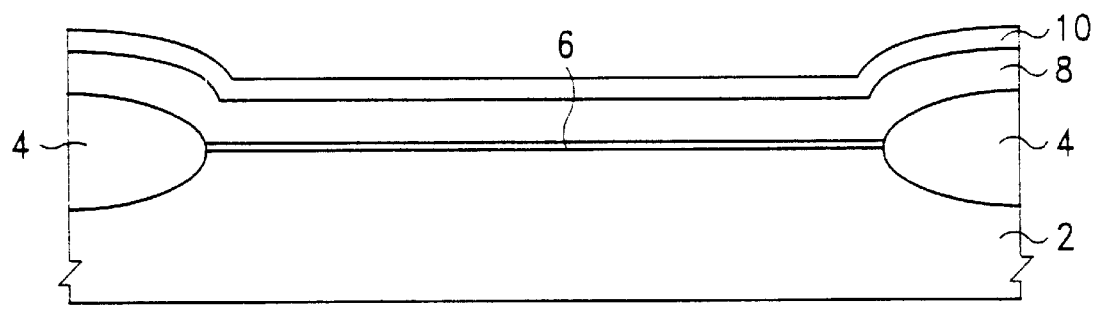
FIG. 2 is a cross-sectional view of a semiconductor substrate illustrating the step of forming a cap silicon nitride layer on the undoped poly-Si layer according to the present invention.

Referring to FIG. 2, a cap silicon nitride layer 10 is deposited on the undoped poly-Si layer 8. In this preferred embodiment, the thickness of the cap silicon nitride layer 10 is approximately 100 to 2000 angstroms.

Figure 3:
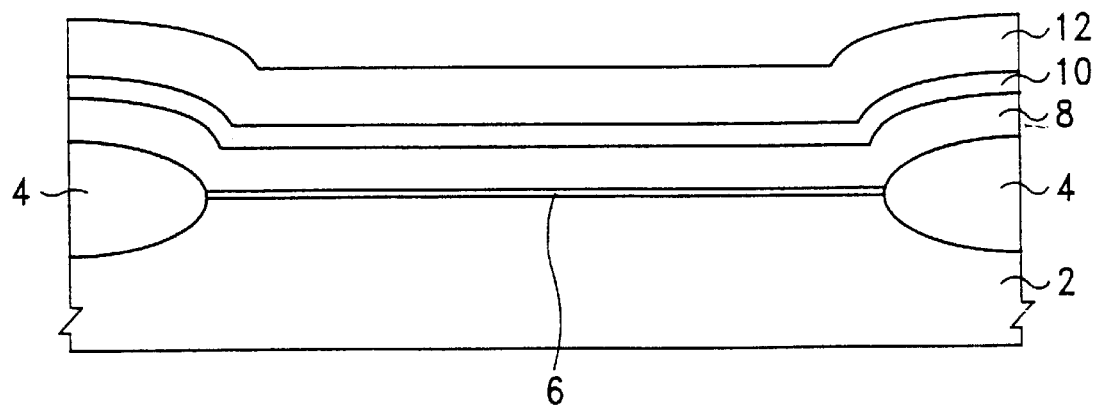
FIG. 3 is a cross-sectional view of a semiconductor substrate illustrating the step of forming n+ doped poly-Si on the cap silicon nitride layer according to the present invention.

Turning to FIG. 3, a n+ doped poly-Si layer 12 is deposited on the cap silicon nitride layer 10. In a preferred embodiment, the thickness of the n+ doped poly-Si layer 12 is approximately 500 to 3000 angstroms.

Figure 4:
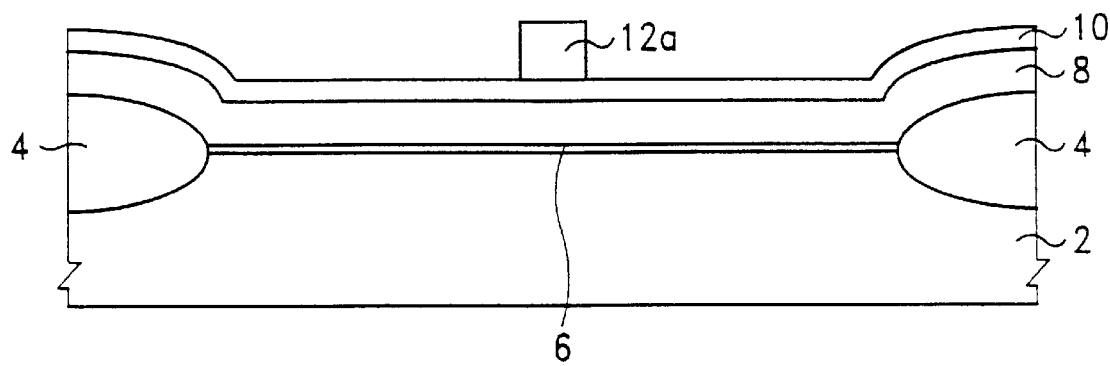
FIG. 4 is a cross-sectional view of a semiconductor substrate illustrating the step of defining a gate region according to the present invention.
Figure 5:
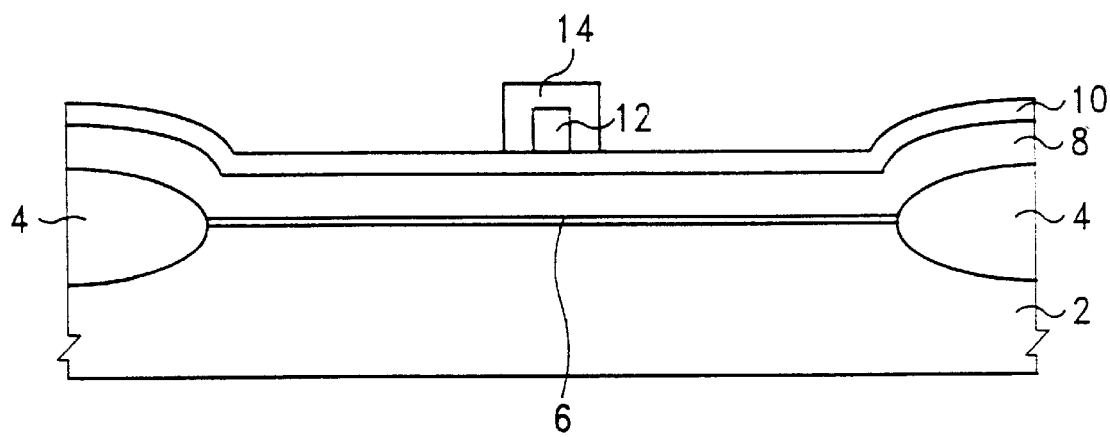
FIG. 5 is a cross-sectional view of a semiconductor substrate illustrating the step of performing a low temperature oxidation on n+ doped poly-Si layer according to the present invention.

Next, referring to FIG. 4, a gate region 12a is defined to etch back the n+ doped poly-Si layer 12 by using a photoresist layer as a mask. Turning to FIG. 5, a low temperature steam oxidation process is subsequently carried out to oxidize the residual n+ doped poly-Si layer 12. After this oxidation process, a thermal polyoxide film 14 will grow on the surface of the residual n+ doped poly-Si layer 12. In a preferred embodiment, the low temperature steam oxidation is performed at a temperature range about 700 to 900 centigrade degrees for 5~60 minutes. Besides, the low temperature steam oxidation can be replaced by a low temperature dry oxidation process. At this step, the size of the residual n+ doped poly-Si film 12 could be reduced to the range of nanometer dimension.

Figure 6:
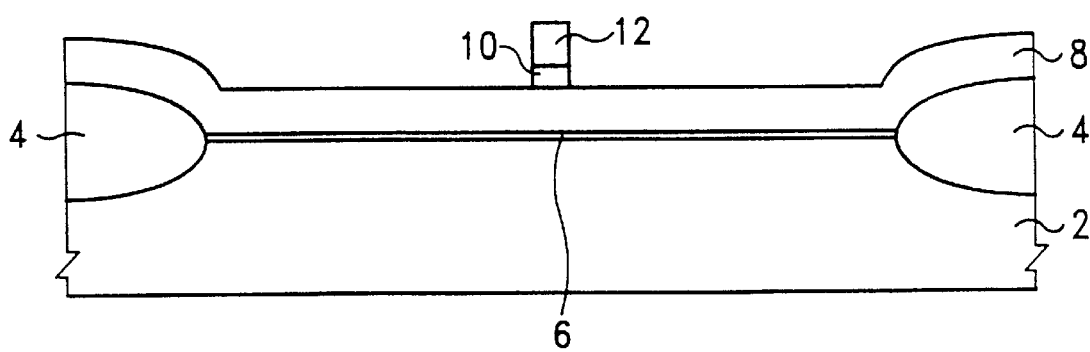
FIG. 6 is a cross-sectional view of a semiconductor substrate illustrating the step of removing the thermal oxide layer and then etching the cap silicon nitride layer according to the present invention.
Figure 7:
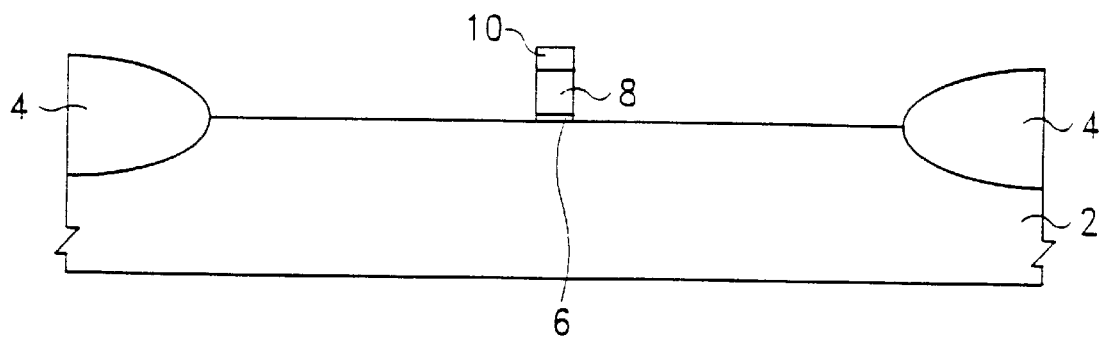
FIG. 7 is a cross-sectional view of a semiconductor substrate illustrating the step of etching the undoped poly-Si layer by using the residual n+ doped poly-Si as a hard mask according to the present invention.

Referring to FIG. 6, the thermal polyoxide film 14 is removed by BOE or dilute HF solution and the residual doped poly-Si film 12 is used as a hard mask to etch the cap silicon nitride layer 10. In a preferred embodiment, the cap silicon nitride layer 10 is removed by a dry etching process. The plasma etchant can be chosen from the group of $CF_4/O_2$, $CHF_3$, $C_2F_6$, $SF_6/He$. Subsequently, the residual doped poly-Si 12 and cap silicon nitride 10 are used as masks to etch the undoped poly-Si layer 8 to form an ultra-short channel gate as shown in FIG. 7. The etchant can be chosen from the group of $SiCl_4/Cl_2$, $BCl_3/Cl_2$, $Br_2/SF_6$.

Figure 8:
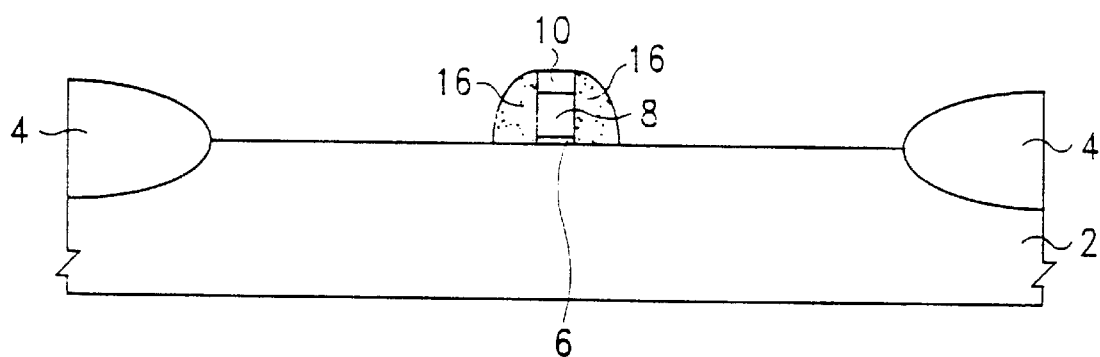
FIG. 8 is a cross-sectional view of a semiconductor substrate illustrating the step of forming a PSG oxide side-wall spacers according to the present invention.

Next, referring to FIG. 8, a phosphosilicate glass (PSG) oxide film 16 is deposited over the FOX 4 (BSG oxide film for pMOSFET), the undoped poly-Si gate 8, and the substrate 2 by a chemical vapor deposition system. Next, an anisotropic etching is performed on the PSG oxide film 16 to form PSG oxide side-wall spacers 16 on the side walls of the gate 8. In this preferred embodiment, the PSG oxide layer 16 is serves as a diffusion source to form the extended S/D junction for the minimum junction depth requirement.

Figure 9:
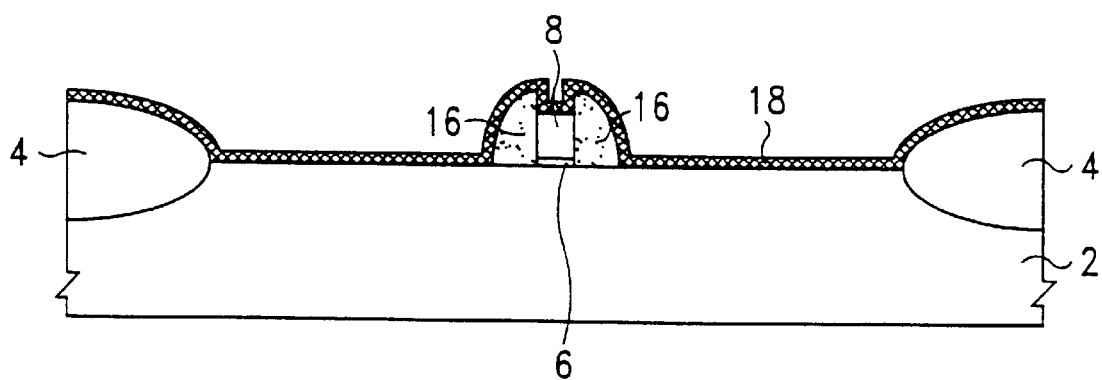
FIG. 9 is a cross-sectional view of a semiconductor substrate illustrating the step of removing the cap silicon nitride layer and then sputtering the noble or refractory metal on the gate and the substrate according to the present invention.

Turning to FIG. 9, the cap silicon nitride film 10 is removed by hot $H_3PO_4$ solution. Following this step, a noble or refractory metal layer 18 is subsequently deposited over all of the area. In this preferred embodiment, the noble metal can be chosen from the group of Ti, W, Co, Pt, Ni, Cr, etc.

Figure 10:
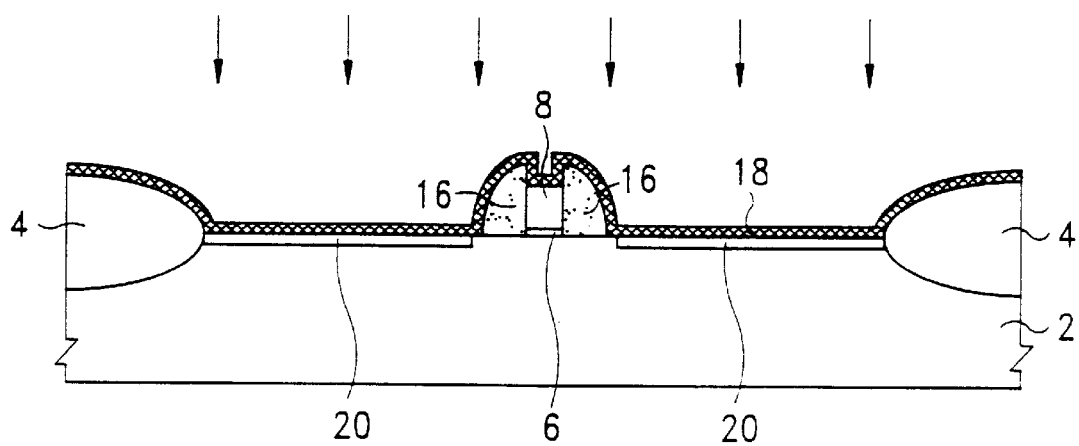
FIG. 10 is a cross-sectional view of a semiconductor substrate illustrating the step of performing an ion implantation to form the source and drain according to the present invention.

Referring to FIG. 10, a high dosage arsenic and/or phosphorus ion implantation is performed through the metal layer 18 to form source/drain regions 20 in the substrate 2 using the gate 8 and the PSG side-wall spacers 16 as mask. In a preferred embodiment, the implantation energy is about 5 to 150 KeV and the dosage of the implantation is about $5 \times 10^{14}$ to $5 \times 10^{16}$ ions/cm$^2$.

Referring to FIG. 11, in order to form salicided contact 22 and extended S/D junction 24, two-step RTP process is carried out. The first rapid thermal process for annealing is performed to form metal silicide 22 on the top surface of the gate 8, and the surface of the source/drain regions 20 in substrate 2. In this preferred embodiment, a first step RTP process is performed to form salicide 22 at the temperature about 300 to 700 Centigrade degree for 30~180 seconds. The metal silicide layer 22 and any of the remaining metal layer 18 is etched thereby leaving the metal silicide 22 on the top surface of gate 8 and in source and drain regions 20. Next, a second RTP process is performed to drive the impurities in PSG spacers to form extended source and drain junction 24. In this preferred embodiment, the second rapid thermal process for annealing is performed at the temperature about 700 to 1150 Centigrade degree for 10~100 seconds.

The benefits of this invention are (1) an ultra-short channel salicided contact MOSFET can be obtained using the current lithography technology, and (2), an extended ultra-shallow S/D junction can be formed by using PSG or BSG film as the diffusion source to improve the short channel effect.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention. For example, the method for fabricating ultra-short channel nMOSFETs devices with self-aligned silicided contact (for nMOSFET PSG can be used for extended S/D junctions) also can be used in fabricating pMOFETS (for pMOSFET BSG could be used for extended S/D junctions) or CMOSFETs.

The embodiments of the invention in which an exclusive property or privilege is claimed are defined as follows:

1. A semiconductor masking structure, comprising:
    a dielectric masking layer;
    a silicon masking layer formed on said dielectric masking layer, said silicon masking layer being formed with a design pattern, wherein said silicon masking layer and said dielectric masking layer collectively serve as a masking structure for patterning of a conductive layer on a semiconductor substrate; and
    a silicon oxide film thermally grown from and conformal to the top surface and sidewalls of said silicon masking layer.

2. A semiconductor structure of the claim 1, wherein said conductive layer is patterned to form gate electrodes.

3. A semiconductor structure of the claim 2, further comprising a gate dielectric layer formed on said semiconductor substrate beneath said conductive layer.

4. A semiconductor structure of the claim 1, wherein said dielectric masking layer is a nitride layer.

5. A semiconductor structure of the claim 1, wherein said silicon masking layer is a polysilicon layer.

6. A semiconductor structure of the claim 1, wherein said silicon oxide film is thermally grown by converting a portion of said silicon masking layer using thermal oxidation.

7. A semiconductor structure for formations of a gate electrode and a gate dielectric, said semiconductor structure comprising:
    a dielectric masking layer;
    a silicon masking layer formed on said dielectric masking layer, said silicon masking layer being formed with a design pattern wherein said silicon masking layer and said dielectric masking collectively serve as a masking structure for patterning of a silicon layer and a dielectric layer on a semiconductor substrate; and
    a silicon oxide film thermally grown from and conformal to the top surface and sidewalls of said silicon masking layer.

8. A semiconductor structure of the claim 7, wherein said first dielectric masking layer is a nitride layer.

9. A semiconductor structure of the claim 7, wherein said silicon masking layer is a polysilicon layer.

10. A semiconductor structure of the claim 7, wherein said silicon oxide film is a thermal oxide film thermally grown by converting a portion of said silicon masking layer using thermal oxidation.

11. A semiconductor structure, comprising:
    a dielectric masking layer;
    a silicon masking layer formed on said dielectric masking layer, said silicon masking layer being formed with a design pattern, wherein said silicon masking layer and said dielectric masking layer collectively serve as a masking structure for patterning of a conductive layer on a semiconductor substrate; and
    a silicon oxide film thermally grown from the top surface and sidewalls of said silicon masking layer by converting a portion of said silicon masking layer using thermal oxidation.

12. A semiconductor structure of the claim 11, wherein said conductive layer is patterned to form gate electrodes.

13. A semiconductor structure of the claim 12, further comprising a gate dielectric layer formed on said semiconductor substrate beneath said conductive layer.

14. A semiconductor structure of the claim 11, wherein said first dielectric masking layer is a nitride layer.

15. A semiconductor structure of the claim 11, wherein said silicon masking layer is a polysilicon layer.

16. A semiconductor structure of the claim 11, wherein said silicon oxide film is thermally grown from the top surface and the sidewalls of said silicon masking layer.

* * * * *